United States Patent
Roos et al.

(10) Patent No.: US 10,599,052 B2
(45) Date of Patent: Mar. 24, 2020

(54) VACUUM SYSTEM, IN PARTICULAR EUV LITHOGRAPHY SYSTEM, AND OPTICAL ELEMENT

(71) Applicant: Carl Zeiss SMT GmbH, Oberkochen (DE)

(72) Inventors: Matthias Roos, Aalen (DE); Eugen Foca, Lauchheim (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/293,774

(22) Filed: Mar. 6, 2019

(65) Prior Publication Data

US 2019/0196344 A1    Jun. 27, 2019

Related U.S. Application Data

(60) Division of application No. 15/430,931, filed on Feb. 13, 2017, now Pat. No. 10,241,421, which is a (Continued)

(30) Foreign Application Priority Data

Aug. 13, 2014    (DE) .................. 10 2014 216 118

(51) Int. Cl.
*G03F 7/20* (2006.01)
*B08B 17/06* (2006.01)
(Continued)

(52) U.S. Cl.
CPC ........ *G03F 7/70841* (2013.01); *B08B 17/065* (2013.01); *G02B 5/0816* (2013.01);
(Continued)

(58) Field of Classification Search
CPC ... A47L 5/24; G03F 7/70841; G03F 7/70033; B08B 17/065; G02B 5/0816
(Continued)

(56) References Cited

U.S. PATENT DOCUMENTS 6,546,592 B1 *  4/2003  Cockburn ................. A47L 5/24
                                                              15/344
9,759,997 B2    9/2017  Chen et al.
(Continued)

FOREIGN PATENT DOCUMENTS

DE        10138036 A1    2/2003
DE     102009044462 A1    1/2011
(Continued)

OTHER PUBLICATIONS

TW First Office Action, dated Mar. 11, 2019, with English translation, 3 pages.
(Continued)

*Primary Examiner* — Hung Nguyen
(74) *Attorney, Agent, or Firm* — Edell, Shapiro & Finnan, LLC (57) ABSTRACT

A vacuum system, in particular an EUV lithography system, includes: a vacuum housing (2), in which a vacuum environment (16) is formed. A surface (2a) of the vacuum housing is subjected to contaminating particles (17) in the vacuum environment. A surface structure (18) at the surface reduces adhesion of the contaminating particles and has pore-shaped depressions (24) separated from one another by webs (25).

10 Claims, 2 Drawing Sheets

Related U.S. Application Data continuation of application No. PCT/EP2015/068066, filed on Aug. 5, 2015.

(51) Int. Cl.
  *G02B 5/08*   (2006.01)
  *G02B 27/00*  (2006.01)
  *G21K 1/06*   (2006.01)

(52) U.S. Cl.
  CPC ....... *G02B 5/0891* (2013.01); *G02B 27/0006* (2013.01); *G03F 7/70033* (2013.01); *G03F 7/70916* (2013.01); *G21K 1/062* (2013.01)

(58) Field of Classification Search
  USPC .......................................................... 355/30
  See application file for complete search history.

(56) References Cited

U.S. PATENT DOCUMENTS

| | | |
|---|---|---|
| 2005/0087699 A1 | 4/2005 | Miyake |
| 2009/0231707 A1 | 9/2009 | Ehm et al. |
| 2011/0186082 A1 | 8/2011 | Yonekawa |
| 2012/0281196 A1 | 11/2012 | Loering et al. |
| 2013/0148200 A1 | 6/2013 | Ehm et al. |

FOREIGN PATENT DOCUMENTS

| | | |
|---|---|---|
| DE | 102011075465 A1 | 11/2012 |
| JP | 2008288299 A | 11/2008 |
| JP | 2009014760 A | 1/2009 |
| JP | 2013127501 A | 6/2013 |
| TW | 200834246 A | 8/2008 |
| WO | 2009059614 A1 | 5/2009 |
| WO | 2013174656 A2 | 11/2013 |

OTHER PUBLICATIONS

TW Search Report, dated Mar. 5, 2019, with English Translation, 2 pages.

Hobbs Douglas S. et al., "Contamination resistant antireflection nano-textures in fused silica for laser optics", Proceedings of SPIE, International Society for Optical Engineering, vol. 8885, Nov. 14, 2013, 11 pages.

Hobbs Douglas S. et al., "Design, fabrication, and measured performance of anti-reflecting surface textures in infrared transmitting materials", Proceedings of SPIE, vol. 5786, No. 1, 2005, Massachusetts, pp. 349-364.

K. L. Johnson et al., "Surface Energy and the Contact of Elastic Solids", Proceedings of the Royal Society of London. Series A, Mathematical and Physica; Science, vol. 324, No. 1558 (Sep. 8, 1971), pp. 301-313.

Gradon, Leon, "Resuspension of particles from surfaces: Technological, environmental and pharmaceutical aspects", vol. 20, Issue 1, Jan. 2009, retrieved from Internet May 23, 2014. Abstract only.

Hamaker, H.C., "The London—Van Der Waals Attraction Between Spherical Particles", Physical 4, No. 10, Nov. 1937, pp. 1058-1072.

Lifshitz, E.M., "The Theory of Molecular Attractive Forces between Solids", Soviet Physics, vol. 2, No. 1, Jan. 1956, pp. 73-83.

Li, A.P. et al., "Hexagonal pore arrays with a 50-420 nm interpore distance formed by self-organization in a anodic alumina", Journal of Applied Physics, vol. 84, No. 11, Dec. 1998, pp. 6023-6026.

Gorzolnik, B. et al., "Nano-structured micropatterns by combination of block copolymer self-assembly and UV photolithography", IOP Publishing, 2014. Abstract only.

Office Action in corresponding German Application 102014216118.5, dated Feb. 3, 2015, along with English Translation.

International Search Report and Written Opinion in counterpart International Application No. PCT/EP2015/068066, dated Nov. 2, 2015.

Japanese Office Action with English translation, Application No. 2017-507747, dated Jul. 23, 2019, 6 pages.

TW Office Action with English Translation, TW Application No. 104126367, dated Aug. 28, 2019, 7 pages.

TW Search Report with English Translation, TW Application No. 104126367, dated Aug. 28, 2019, 2 pages.

* cited by examiner

VACUUM SYSTEM, IN PARTICULAR EUV LITHOGRAPHY SYSTEM, AND OPTICAL ELEMENT

CROSS REFERENCE TO RELATED APPLICATIONS

This is a Divisional of U.S. patent application Ser. No. 15/430,931, filed on Feb. 13, 2017, which is a Continuation of International Application PCT/EP2015/068066, which has an international filing date of Aug. 5, 2015, and the disclosure of which is incorporated in its entirety into the present Divisional by reference. The following disclosure is also based on and claims the benefit of and priority under 35 U.S.C. § 119(a) to German Patent Application No. DE 10 2014 216 118.5, filed Aug. 13, 2014, which is also incorporated in its entirety into the present Divisional by reference.

FIELD OF THE INVENTION

The invention relates to a vacuum system, in particular an EUV lithography system, comprising: a vacuum housing, in which a vacuum environment is formed, and also at least one component having a surface which is subjected to contaminating particles in the vacuum environment. The invention also relates to an optical element, comprising: a substrate, and also a multilayer coating for reflecting EUV radiation, said multilayer coating being applied to the substrate.

BACKGROUND

In specific optical arrangements, for example in extreme ultraviolet (EUV) lithography systems, it is necessary to arrange at least one portion of the beam path and thus also at least one portion of the optical elements in a vacuum environment. Such a vacuum environment can typically have a (total) pressure of between approximately $10^{-9}$ mbar and approximately $10^{-1}$ mbar in EUV lithography systems.

Within the meaning of this application, an EUV lithography system is understood to be an optical system for EUV lithography, i.e. an optical system which can be used in the field of EUV lithography. Alongside an EUV lithography apparatus that serves for producing semiconductor components, the optical system can be, for example, an inspection system for inspecting a photomask (also called reticle hereinafter) used in an EUV lithography apparatus, or for inspecting a semiconductor substrate (also called wafer hereinafter) to be structured, or a metrology system that is used for measuring an EUV lithography apparatus or parts thereof, for example for measuring a projection system.

In an EUV lithography system, but also in other optical arrangements, the presence of contaminating substances or particles in the vacuum environment or in the residual gas atmosphere present therein cannot be completely avoided. The contaminating substances can be polymers, for example, which originate from vacuum pumps or which are outgassed from adhesives. The contaminating substances can also be residues of photoresists applied on the wafer which are outgassed from the photoresist under the influence of the operating radiation and which can lead to carbon contaminations on the optical elements of the EUV lithography system or on other components in the vacuum environment.

It is known to remove contaminating substances or particles from optical surfaces with the aid of one gas nozzle or a plurality of gas nozzles, as is described for example in WO 2009/059614 A1 in the name of the applicant. For this purpose, the gas nozzle is aligned with the surface to be cleaned, and the surface to be cleaned is brought into contact with a gas flow of a cleaning gas, e.g. in the form of activated hydrogen or in the form of hydrogen radicals.

The efficiency of such cleaning depends on how strongly the contaminating particles adhere to the surface to be cleaned, i.e. the strength of the adhesion of the particles to the surface. Generally, in a vacuum environment, surfaces should be avoided which foster particle deposits, in particular surfaces having a high roughness, for which reason components having surfaces composed of electropolished high-grade steel or aluminium having very low roughness are often used in vacuum environments.

DE 10 2009 044 462 A1 discloses an optical element for filtering electromagnetic radiation, said optical element having a multilayer structure designed for reflecting EUV radiation. The optical element also has a grating structure designed for diffracting radiation in the visible to infrared wavelength range. In one example, the grating structure is designed for the destructive interference of radiation having an infrared wavelength of e.g. 10.6 μm. On the grating structure, it is possible to arrange an additional grating structure having a smaller grating constant and depth, which generates a destructive interference of radiation at at least one further wavelength that is significantly shorter than the wavelength of the radiation that is filtered by the grating structure.

SUMMARY

It is an object of the invention to provide a vacuum system, in particular an EUV lithography system, and also an optical element which feature reduced adhesion of particles on at least one surface.

This and other objects are achieved with a vacuum system of the type mentioned in the introduction in which a surface structure is formed at the surface which is arranged in the vacuum environment and therefore comes into contact with contaminating particles, in order to reduce the adhesion of the contaminating particles, said surface structure having pore-shaped depressions separated from one another by webs.

The inventor has recognized that a surface structure having pore-shaped depressions, i.e. blind holes typically having a small depth of the order of magnitude of micrometres or, if appropriate, nanometres, can exhibit a more greatly reduced adhesion than is the case for a completely smooth surface. The pore-shaped depressions typically are not connected to one another since they are separated from one another by the webs and are typically distributed in a substantially regular arrangement over the surface. The pore-shaped depressions generally have a substantially rectangular depth profile. In particular, the lateral edges of the pore-shaped depressions should be as steep as possible.

For reducing the adhesion, use is made of the fact that particles which come into contact with a surface experience an adhesion force that is substantially based on the interaction within the area of contact with the surface. The area of contact can be described for example by the contact radius in the so-called JKR model (K. L. Johnson, K. Kendall, A. D. Roberts, "Surface energy and the contact of the elastic solids", Proc. Roy. Soc. London 324, 301 (1971)). For particles which are in direct contact with the surface, the interaction of the particles with the surface is dominated by van der Waals forces, cf. L. Gradon, "Resuspension of particles from surfaces: Technological, environmental and pharmaceutical aspects", Adv. Powder Tech. 20, 17 (2009). On account of the short range of the van der Waals forces, a small distance between the particles and the surface already results in a significant reduction of the adhesion forces. For the energy $U_{vdw}$ between two interacting bodies as a function of the distance d, the following relationship generally holds true here:

$$U_{vdw} = -B/d^6, \qquad (1)$$

wherein B denotes the interaction coefficient.

To describe the adhesion of a particle of arbitrary shape, for illustrative reasons recourse can also be made to the concept of the summation of the pairwise interactions (according to Hamaker), cf. H. C. Hamaker, "The London-van der Waals attraction between spherical particles", Physica IV, 10, 1058 (1937). A particle (in the same way as the associated surface) can be described as a finite number of entities, wherein the contribution to the total adsorption of each entity of the particle arises as a result of summation of the interaction energies over all the entities of the surface under consideration in accordance with equation (1). Although this approach disregards matrix effects that occur, it is a good approximation for the case of small distances d, cf. E. M. Lifshitz, "The theory of molecular attractive forces between solids", Soviet Phys. JETP, 2, 73 (1956) and can thus be useful for the argumentation below.

In one advantageous embodiment, the pore-shaped depressions have a diameter which is smaller than the diameter of the contaminating particles in the vacuum environment whose adhesion to the surface is intended to be reduced. Within the meaning of this application, the diameter of a particle is understood to be that diameter of a sphere whose volume corresponds to the volume of the (generally non-spherical) particle. The diameter of the pore-shaped depression is understood to be that diameter of a circle whose surface corresponds to the surface of the (not necessarily circular) pore-shaped depression. In this case, the surface of the pore-shaped depression is measured at the top side thereof facing the vacuum environment.

The principle of the surface structure for reducing particle adhesion as described in the present application is based on the sum of all the pairwise interactions being significantly reduced by virtue of the fact that the possible number of near-surface atoms within a particle, represented by the area of contact between particle and surface, is greatly reduced on account of steric hindrance. For particles having a specific size or order of magnitude, this can be achieved by the surface being provided with a substantially regular surface structure over the whole area, in the case of which surface structure the diameters of the pore-shaped depressions are smaller than the diameters of a respective contaminating particle whose adhesion to the surface is intended to be prevented.

On account of their larger diameter, the particles cannot penetrate into the pore-shaped depressions and therefore rest on the circumferential edges of the webs which form the area of contact. Since pore-shaped depressions having a given diameter generally cannot effectively prevent the adhesion of particles having a significantly larger particle diameter, it can be advantageous to form a surface structure having pore-shaped depressions having different diameters, in particular a surface structure having pore-shaped depressions having diameters of different orders of magnitude. In this case, the diameter specified above constitutes a minimum diameter of the pore-shaped depressions, which constitutes a lower limit for the particle size which can be prevented from adhesion to the surface with the aid of the surface structure.

The width of the webs should not be chosen to be excessively large, in order to prevent the particles from resting on the top side of the webs. This can be achieved, for example, by the webs having a width that is likewise smaller than the diameter of the contaminating particles. The pore-shaped depressions can be arranged at the surface of the component for example in a regular, in particular hexagonal, pattern.

In one embodiment, the pore-shaped depressions have a diameter of less than e.g. 10 nm. As was described further above, the diameter of the depressions defines the minimum particle size or the minimum particle diameter which can be prevented from adhesion with the aid of the surface structure.

Preferably, the web widths of the surface structure are smaller than the diameters of the pore-shaped depressions of the surface structure. The constitution of the webs should be chosen such that the adhesion of particles to the top side of the webs is of the order of magnitude of the adhesion of particles which are situated above the pore-shaped depressions. This can be achieved by the choice of a suitable ratio between the diameter of the pore-shaped depressions and the width of the webs, wherein the width of the webs, as specified above, generally should not be greater than the diameter of the pore-shaped depression.

In a further embodiment, the depth of a respective pore-shaped depression is at least as large as half the diameter of a respective pore-shaped depression. The pore-shaped depressions should not have an excessively small depth, in order to prevent the particles that rest on the edges of the webs from reaching the bottom of the depression and the area of contact between the particles and the surface being increased as a result.

In a further embodiment, the surface structure has at least one periodic pore structure. A periodic or quasi-periodic pore structure is understood to be a structure in which the pore-shaped depressions (of the same size) and the webs (of the same size) form a regular pattern. The periodic pore structure need not necessarily be exactly periodic, rather it suffices if a substantially periodic pore structure is present in which the diameters of different pore-shaped depressions and the widths of different webs are substantially of the same magnitude, as is the case e.g. for a self-structuring. The period length of the pore structure is defined as the sum of the diameter of a pore-shaped depression and the width of a web between two adjacent pore-shaped depressions. The effect of such a pore structure with regard to the reduction of the adhesion of particles is efficient if the periodicity of the pore structure is of the order of magnitude of the particle diameter. As a result of a pore structure being provided, therefore, the adhesion of particles of a specific order of magnitude can be prevented from adhesion.

Preferably, the periodic pore structure has a period length of less than e.g. 10 nm. The period length of the pore structure defines the minimum particle diameter which can be prevented from adhesion by the pore structure. As was described further above, it is necessary for the diameter of a pore-shaped depression to be smaller than the diameter of the particle to be prevented from adhesion. The width of the webs should typically not be greater than the diameters of the depressions.

In one development, the surface structure has a first periodic pore structure having a first period length and a second periodic pore structure applied to the first periodic pore structure and having a second period length, which is smaller than the period length of the first periodic pore structure. As was described further above, the period length defines the minimum particle diameter or the order of magnitude of the diameter of the particles whose adhesion to the surface can be prevented. Particles having a particle diameter that is significantly greater than the period length of the pore structure cannot be effectively prevented from adhesion by the pore structure. Therefore, it is advantageous to produce a surface structure having two or more pore structures having different period lengths, which prevents particles having different orders of magnitude of the particle diameter from adhesion.

The surface structure can have a third periodic pore structure—applied to the second periodic pore structure—having a third period length, which is smaller than the period length of the second periodic pore structure. Correspondingly, the surface structure can also have a fourth, fifth, etc. pore structure having a respectively decreasing period length in order to prevent particles having a plurality of different orders of magnitude of the particle diameter from adhesion.

In one development, the first period length P1 is at least five times the magnitude of the second period length P2, that is to say that P1>5×P2 holds true. The period lengths of the pore structures should not be too close together, in order to prevent particles having different orders of magnitude of the particle diameter from adhesion. In particular, the second period length can also be at least five times the magnitude of the third period length of a third pore structure possibly present.

A surface structure having the properties described above can be produced in various ways. By way of example, the surface can be structured using a photolithographic process. In order to realize a large-area structuring of a surface with comparatively little effort, it is possible to have recourse to structuring methods which enable a certain degree of self-assembly.

In the case of a component having a surface composed of aluminium, highly ordered aluminium oxide layers having hexagonally arranged pores can be produced by anodic oxidation in aqueous electrolytes under suitable conditions (pH, electrolyte, voltage and temperature). In this case, e.g. by varying the voltage, it is possible to define the pore diameter and thereby to realize periodicities of from a few nanometres to the micrometres range, as is described in the article by A. P. Li et al. "Hexagonal pore arrays with a 50-420 nm interpore distance formed by self-organisation in anodic alumina", J. Appl. Phys. 84 (11), 6023 (1998).

For very small periodicities of a few nanometres, the structures can also be realized through a micellar approach, which is based on the self-assembly of block copolymers loaded with metal salts and a subsequent lithography process, as is described in the article by B. Gorzolnik et al. "Nano-structured micropatterns by combination of block copolymer self-assembly and UV photolithography", Nanotechnology 17, 5027 (2006).

In order to produce the superimposition of a plurality of periodic pore structures having different period lengths, as described further above, it is possible to use a multiple structuring process in which pore structures having a large pore diameter or a large period length are firstly produced in a first structuring step and pore structures having a smaller period length are produced in at least one subsequent structuring step.

A further aspect of the invention relates to an optical element of the type mentioned in the introduction in which a surface structure is formed at the surface of the multilayer coating in order to reduce the adhesion of contaminating particles. The surface structure has pore-shaped depressions separated from one another by webs. In this aspect of the invention, the component which is subjected to the contaminating particles is an optical element of EUV lithography, which can be used in particular in the EUV lithography system described further above. The depth of the surface structure should not be chosen to be excessively large, in order to prevent the reflectivity of the multilayer coating for the EUV radiation from being impaired to an excessively great extent. In this case, the depth of the pore-shaped depressions should typically not be greater than approximately 3 µm. Not only components in the form of optical elements but also other components, in particular vacuum components, e.g. vacuum housings, or housings of sensors which are arranged in the vacuum environment, can be provided with the surface structure described further above.

In one embodiment, the pore-shaped depressions have a diameter which is smaller than the diameter of the contaminating particles whose adhesion to the surface is intended to be reduced. As was described further above, the diameter of the depressions determines the minimum diameter of particles which can be prevented from adhesion with the aid of the surface structure.

In a further embodiment, the or all pore-shaped depressions at the surface have a diameter of less than e.g. 10 nm. As was described above, the minimum diameter of the pore-shaped depressions defines the smallest particle diameter of the particles which can be prevented from adhesion by the surface structure.

In one embodiment, the web widths of the surface structure are smaller than the diameters of the pore-shaped depressions of the surface structure, such that no large-area interaction between particle and surface can occur. As an alternative to defining this ratio by choosing the diameter of the pore-shaped depressions with respect to the width of the webs, it is also possible for the desired ratio to be established as a side effect of the superimposition of a plurality of periodic structures having different period lengths, as described further above, since, during the application of a pore structure having a smaller period length, the webs of the underlying pore structure having a larger period length are structured as well.

In a further embodiment, the depth of a respective pore-shaped depression is at least as large as half the diameter of a respective pore-shaped depression. An undesirable contact between the particles and the bottom of the pore-shaped depressions can be avoided in this way.

In a further embodiment, the surface structure has at least one periodic pore structure which preferably has a period length of less than e.g. 10 nm. Such a periodic pore structure can be produced by a self-structuring, for example.

In one development, the surface structure has a first periodic pore structure having a first period length and a second periodic pore structure applied to the first periodic pore structure and having a second period length, which is smaller than the period length of the first periodic pore structure. As was described further above, in this way particles having particle diameter having different orders of magnitude can be prevented from adhesion. In order to prevent particles having different orders of magnitude of the particle diameter from adhering to the surface, preferably the first period length is at least five times the magnitude of the second period length.

Further features and advantages of the invention are evident from the following description of exemplary embodiments of the invention, with reference to the figures of the drawing which show details essential to the invention, and from the claims. The individual features can each be realized individually by themselves or as a plurality in any desired combination in a variant of the invention.

BRIEF DESCRIPTION OF THE DRAWINGS

Exemplary embodiments are illustrated in the schematic drawing and are explained in the following description. In the figures.

In the following description of the drawings, identical reference signs are used for identical or functionally identical components.

DETAILED DESCRIPTION

Figure 1:
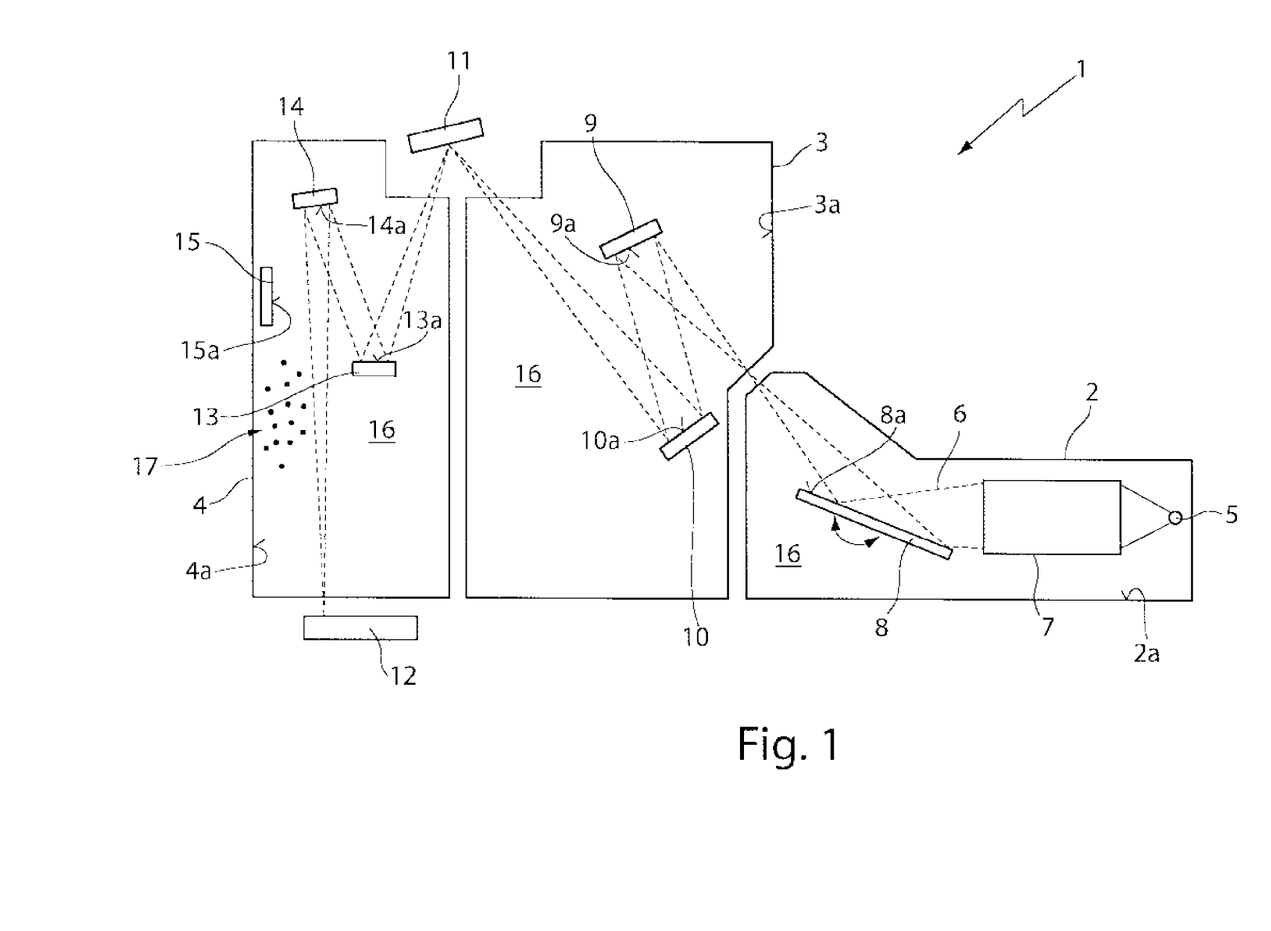
FIG. 1 shows a schematic illustration of an EUV lithography apparatus.

FIG. 1 schematically shows a vacuum system in the form of an EUV lithography apparatus 1 consisting of a beam shaping system 2, an illumination system 3 and a projection system 4, which are accommodated in separate vacuum housings (designated with the same reference signs) and are arranged successively in a beam path 6 proceeding from an EUV light source 5 of the beam shaping system 2. By way of example, a plasma source or a synchrotron can serve as EUV light source 5. The emerging radiation in the wavelength range of between approximately 5 nm and approximately 20 nm is firstly focussed in a collimator 7. With the aid of a downstream monochromator 8, the desired operating wavelength is filtered out by varying the angle of incidence, as indicated by a double-headed arrow. In the stated wavelength range, the collimator 7 and the monochromator 8 are usually embodied as reflective optical elements, wherein at least the monochromator 8 has no multilayer coating at its optical surface, in order to reflect a wavelength range having the highest possible bandwidth.

The radiation treated with regard to wavelength and spatial distribution in the beam shaping system 2 is introduced into the illumination system 3, which has a first and a second reflective optical element 9, 10. The two reflective optical elements 9, 10 direct the radiation onto a photomask 11, which operates as as a further reflective optical element, said photomask having a structure which is imaged onto a wafer 12 on a reduced scale via the projection system 4. For this purpose, a third and a fourth reflective optical element 13, 14 are provided in the projection system 4.

The reflective optical elements 9, 10, 11, 12, 13, 14 respectively have an optical surface 9a, 10a, 11a, 12a, 13a, 14a, which are arranged in the beam path 6 of the EUV lithography apparatus 1. A further, mechanical component 15 is also arranged in the projection system 4, for example in the form of a sensor or of part or, if appropriate, of the entire inner side 2a of a housing wall of the vacuum housing 2 (or an inner surface 3a, 4a of a housing wall of the other vacuum housings 3, 4). The component 15 likewise has a surface 15a arranged in a vacuum environment 16 in the projection system 4. The vacuum environment 16 is generated with the aid of vacuum pumps (not shown). The total pressure in the vacuum environment 16 of the beam shaping system 2, of the illumination system 3 and of the projection system 4 can be different. The total pressure is typically in the range of between approximately $10^{-9}$ mbar and approximately $10^{-1}$ mbar.

Figure 2:
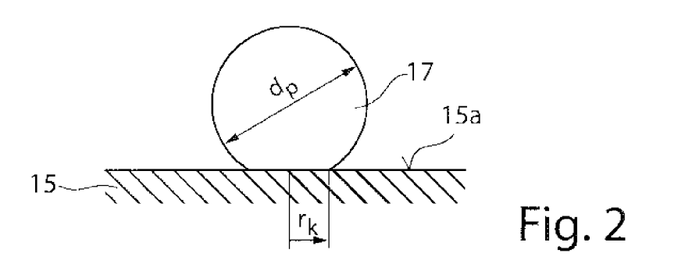
FIG. 2 shows a schematic illustration of a particle on a surface.

As can likewise be seen in FIG. 1, the vacuum environment 16 of the projection system 4 contains contaminating particles 17 to which the surfaces 9a to 14a of the optical elements 9 to 14 and the surface 15a of the mechanical component 15 are subjected. FIG. 2 shows by way of example a detail from the surface 15a of the mechanical component 15, which is a vacuum component composed of aluminium in the example shown. A particle 17 illustrated as spherical in an idealized way has deposited on the planar, polished surface 15a of the component 15. The area of contact, assumed to be circular likewise in an idealized way, between the particle 17 and the surface 15a has a contact radius $r_k$ that is relatively large in comparison with the diameter $d_P$ of the particle 17.

In order to reduce the area of contact between the particle 17 and the surface 15a, a surface structure 18 can be applied to the surface 15a, said surface structure reducing the area of contact of the particle 17 with the surface 15a and thus the adhesion of the particle 17 to the surface 15a. Such a surface structure 18, which can also be provided on the surface 15a of the component 15, is shown in FIGS. 3A and 3B on the basis of the example of the last optical element 14 in the beam path of the EUV lithography apparatus 1 from FIG. 1.

Figure 3A:
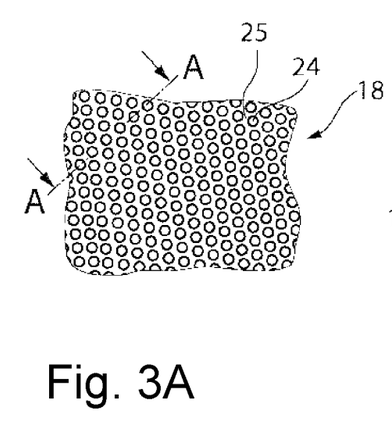
FIGS. 3A and 3B show schematic illustrations of a surface structure formed on a multilayer coating of an EUV mirror, in a plan view and in a sectional illustration.
Figure 3B:
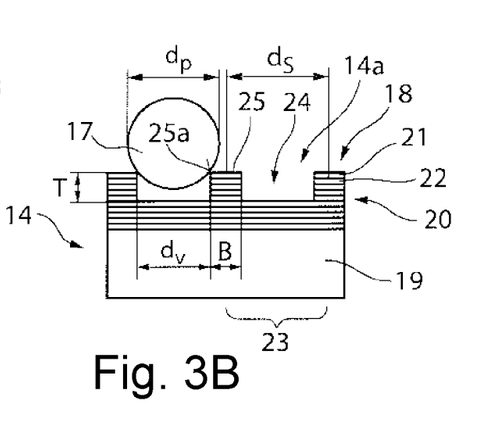

The optical element 14 shown in a sectional view in FIG. 3B comprises a substrate 19 and a multilayer coating 20 applied to the substrate 19. The multilayer coating 20 comprises alternately applied layers of a material having a higher real part of the refractive index at the operating wavelength $\lambda_B$ (also called spacers 21) and of a material having a lower real part of the refractive index at the operating wavelength $\lambda_B$ (also called absorbers 22), wherein an absorber-spacer pair forms a stack. This construction of the multilayer coating 20 simulates in a way a crystal whose lattice planes correspond to the absorber layers at which Bragg reflection takes place. The thicknesses of the individual layers 21, 22 and of the repeating stacks can be constant or else vary over the entire multilayer coating 20, depending on what spectral or angle-dependent reflection profile is intended to be achieved. The absorber and spacer materials can have constant or else varying thicknesses over all the stacks in order to optimize the reflectivity. Furthermore, it is also possible to provide additional layers for example as diffusion barriers between spacer and absorber layers 21, 22.

In the present example, in which the optical element 14 was optimized for an operating wavelength $\lambda_B$ of 13.5 nm, i.e. in the case of an optical element 14 which has the maximum reflectivity for substantially normal incidence of radiation at a wavelength of 13.5 nm, the stacks of the multilayer coating 20 have alternate silicon and molybdenum layers. In this case, the silicon layers correspond to the layers 21 having a higher real part of the refractive index at 13.5 nm, and the molybdenum layers correspond to the layers 22 having a lower real part of the refractive index at 13.5 nm. Other material combinations such as e.g. molybdenum and beryllium, ruthenium and beryllium or lanthanum and $B_4C$ are likewise possible, depending on the operating wavelength.

As shown in FIG. 3B, a surface structure 18 is formed at the surface 14a of the multilayer coating 20, said surface structure having a periodic pore structure 23 having pore-shaped depressions 24 separated from one another by webs 25, wherein the surface structure 18 has a substantially hexagonal structure, as illustrated in FIG. 3A (each pore-shaped depression 24 is surrounded by six further pore-shaped depressions 24). The pore-shaped depressions 24 have a substantially circular geometry having a diameter $d_V$ which, in the example shown, is smaller than the diameter $d_P$ of a particle 17 arranged above the pore-shaped depression. In the sectional view through the optical element 14 as shown in FIG. 3b, the pore-shaped depressions 24 and the webs 25 form a binary or rectangular surface profile, i.e. the flanks of the webs 25 run approximately vertically and the bottom of the pore-shaped depressions 24 runs substantially parallel to the planar surface of the substrate 19 to which the multilayer coating 20 is applied.

As shown in FIG. 3B, the period length $d_s$ of the periodic pore structure 23, which corresponds to the sum of the diameter $d_V$ of the pore-shaped depression 24 and the width B of the web 25, is slightly larger than the diameter $d_P$ of the particle 17. By contrast, the diameter $d_v$ of the pore-shaped depression 24 is slightly smaller than the diameter $d_P$ of the contaminating particle 17. The area of contact between the contaminating particle 17 and the surface 14a of the optical element 14 is therefore formed exclusively by the circularly circumferential edge 25a of the web 25, which is significantly smaller than the area of contact between the particle 17 and the planar surface 14a from FIG. 2.

In the example shown, the depth T of a respective pore-shaped depression 24 is somewhat more than half the magnitude of the diameter $d_P$ of the pore-shaped depression 24. In this way, it is ensured that a spherical particle 17 that is slightly larger than the diameter $d_P$ of the pore-shaped depression 24, if it contacts the circumferential edge 25a of the web 25 delimiting the depression 24, does not rest on the bottom of the depression 24 and the area of contact with the surface 14a is increased in this way.

In general, the adhesion of particles 17 that are situated above the pore-shaped depressions 24 should be of the order of magnitude of the adhesion of particles 17 that are situated on the webs 25. The ratio between the adhesion at the depressions 24 and the adhesion at the webs 25 can be set by the ratio between the diameter $d_v$ of the pore-shaped depressions 24 and the width B of the webs 25. In principle, in the case of a surface structure 18 having exactly one periodic pore structure 23, it has proved to be advantageous if the widths B of the webs 25 of the surface structure 18 are smaller than the diameters $d_V$ of the pore-shaped depressions 24 of the surface structure 18. Fulfilling such a condition imposed on the widths B of the webs 25 is generally not necessary, however, if the surface structure 18 has two or more, for example three, periodic pore structures 23a-c, as is shown in FIG. 4.

Figure 4:
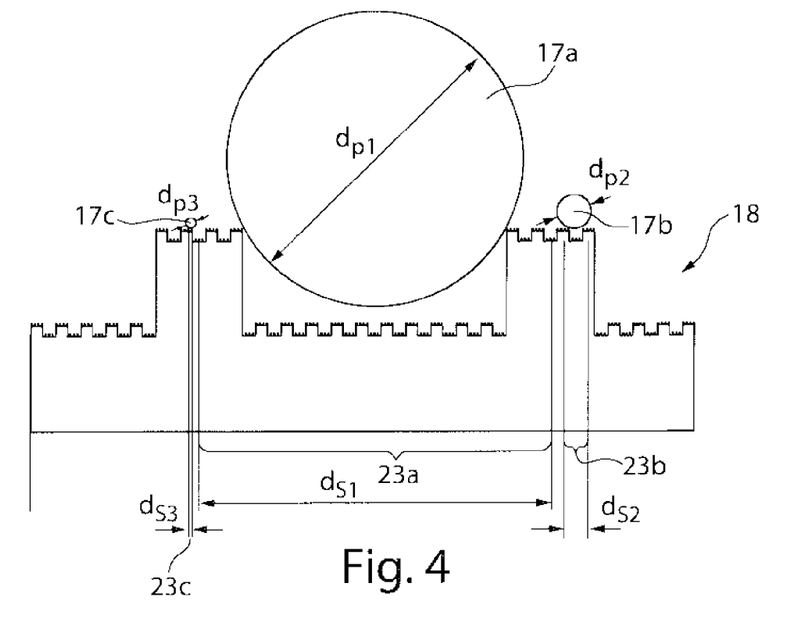
FIG. 4 shows a schematic illustration of a surface structure having three periodic pore structures having different period lengths.

The surface structure 18 shown in FIG. 4 has a first periodic pore structure 23a, which has a first period length $d_{S1}$ and which serves for reducing the adhesion of particles 17a having a first (average) particle diameter $d_{P1}$. A second periodic pore structure 23b is superimposed on the first periodic pore structure 23a, said second periodic pore structure having a second, smaller period length $d_{S2}$ and serving for reducing the adhesion of particles 17b having a second, smaller particle diameter $d_{P2}$. A third periodic pore structure 17c is superimposed on the second periodic pore structure 17b, said third periodic pore structure having a third period length $d_{S3}$ that is smaller than the second period length $d_{S2}$ and serving for reducing the adhesion of particles 17c having a third particle diameter $d_{p3}$ that is smaller than the second particle diameter $d_{p2}$.

As was described further above, a surface structure 18 having a periodic pore structure having a predefined period length $d_{S1}$ to $d_{S3}$ can typically only prevent the adhesion of particles 17a-c whose particle diameter $d_{P1}$ to $d_{P3}$ is of a predefined order of magnitude. The surface structure shown in FIG. 4 serves to prevent the adhesion of particles 17a-c having particle diameters $d_{P1}$ to $d_{P3}$ which are of different orders of magnitude. For this purpose, it is necessary that the period lengths $d_{S1}$ to $d_{S3}$ of the periodic pore structures 17a-c are not too close to one another. Therefore, the first period length $d_{S1}$ should be of at least five times the magnitude of the second period length $d_{S2}$ and the second period length $d_{S2}$ should be of at least five times the magnitude of the third period length $d_{S3}$. The third, i.e. smallest, period length $d_{S3}$ defines the minimum particle diameter $d_{p3}$ which can be prevented from adhesion by the surface structure 18. In the example shown, the third period length $d_{S3}$ is less than e.g. 10 nm.

The surface structure 18 shown in FIG. 4 can be provided both at the surface 14a of an optical element 14 and at the surface 15a of a non-optical component 15 of the EUV lithography system 1. The surface structure 18 shown in FIGS. 3A and 3B can, of course, also be provided at the surface 15a of a non-optical component 15. The use of periodic or approximately periodic pore structures 23, 23a-c has proved to be advantageous since such structures can be applied with the aid of structuring methods in which the surface structure or the surface structures is or are formed by self-assembly.

By way of example for the case where the surface 15a of the non-optical component 15 is formed from aluminium, the surface structure 18 shown in FIGS. 3a,b can be produced by anodic oxidation in aqueous electrolytes, as is described in the article—cited further above—by A. P. Li et al. "Hexagonal pore arrays with a 50-420 nm interpore distance formed by self-organisation in anodic alumina", J. Appl. Phys, 84 (11), 6023 (1998). In particular, in the case of the method described therein, the period length $d_S$ of the periodic pore structure 23 or the diameter $d_V$ of a respective pore-shaped depression 24 can be varied by variation of the applied voltage within wide limits (from a few nanometres to the micrometres range).

However, the surface structure 18 can also be realized with the aid of lithographic methods, i.e. by applying a light-sensitive coating to the surface 9a, 10a, 13a, 14a, 15a, exposing the light-sensitive layer for the purpose of structuring the light-sensitive layer, removing the coating in the non-structured regions, and etching the surface 9a, 10a, 13a, 14a, 15a for the purpose of producing the pore-shaped depressions in the regions not protected by the structured coating. In a subsequent step, the structured coating serving as an etching mask is removed completely from the surface 9a, 10a, 13a, 14a, 15a having the desired surface structure 18.

In order to produce a surface structure 18 such as is illustrated in FIG. 4, a plurality of such lithographic structuring processes can be performed successively. In order to produce very small structures of a few nanometres, for example the third periodic pore structure 23c having the third period length $d_{S3}$ as shown in FIG. 4, a micellar approach can be used for structuring, this approach being based on the self-assembly of block copolymers loaded with metal salts in conjunction with a subsequent lithography process, as is described in the article—described further above—"Nano-structured micropatterns by combination of block copolymer self-assembly and UV photolithography", in Nanotechnology 17, 5027 (2006).

To summarize, by providing a surface structure 18 at a surface 9a, 10a, 13a, 14a, 15a which is arranged in a vacuum environment 16 and which is therefore subjected to contaminating particles 17 whose particle diameters are generally not in the macroscopic range, it is possible to achieve an effective reduction of the adhesion of these particles 17 to the surface 9a, 10a, 13a, 14a, 15a. The particles 17 that do not adhere to the surface 9a, 10a, 13a, 14a, 15a can be removed from the vacuum system, for example the EUV lithography system 1, through an extraction by suction (vacuum pumps).

What is claimed is:

1. A vacuum system, comprising:
a vacuum housing of a lithography system for extreme ultraviolet (EUV) radiation, in which a vacuum environment is formed, wherein a surface of the vacuum housing is subjected to contaminating particles in the vacuum environment,
wherein a surface structure at the surface reduces adhesion of the contaminating particles, and wherein the surface structure has blind pore-shaped depressions separated from one another by webs, wherein the blind pore-shaped depressions comprise a depth of an order of magnitude of micrometres or less.

2. The vacuum system according to claim 1, wherein the pore-shaped depressions have respective diameters ($d_V$) which are smaller than diameters ($d_P$) of the contaminating particles in the vacuum environment.

3. The vacuum system according to claim 1, wherein the pore-shaped depressions have a diameter ($d_v$) of less than 10 nm.

4. The vacuum system according to claim 1, wherein web widths (B) of the surface structure are smaller than the respective diameters ($d_V$) of the pore-shaped depressions of the surface structure.

5. The vacuum system according to claim 1, wherein a depth (T) of a respective pore-shaped depression is at least as large as half the diameter ($d_V/2$) of a respective one of the pore-shaped depressions.

6. The vacuum system according to claim 1, wherein the surface structure has at least one periodic pore structure.

7. The vacuum system according to claim 6, wherein the periodic pore structure has a period length ($d_S$, $d_{S3}$) of less than 10 nm.

8. The vacuum system according to claim 6, wherein the surface structure has a first periodic pore structure having a first period length ($d_{S1}$) and a second periodic pore structure applied to the first periodic pore structure and having a second period length ($d_{S2}$) which is smaller than the period length ($d_{S1}$) of the first periodic pore structure.

9. The vacuum system according to claim 8, wherein the first period length ($d_{S1}$) is at least five times the second period length ($d_{S2}$).

10. The vacuum system according to claim 1, wherein the surface structure is formed on an inner side of the vacuum housing of a beam shaping system, an illumination system, or a projection system of the lithography system.

* * * * *

UNITED STATES PATENT AND TRADEMARK OFFICE
CERTIFICATE OF CORRECTION

PATENT NO. : 10,599,052 B2
APPLICATION NO. : 16/293774
DATED : March 24, 2020
INVENTOR(S) : Matthias Roos et al.

Page 1 of 1

It is certified that error appears in the above-identified patent and that said Letters Patent is hereby corrected as shown below:

In the Specification

Column 7, Line 51, Delete "as as" and insert -- as --, therefor.

Signed and Sealed this
Third Day of November, 2020

Andrei Iancu
*Director of the United States Patent and Trademark Office*